(12) United States Patent
Gerousis et al.

(10) Patent No.: US 11,552,067 B2
(45) Date of Patent: Jan. 10, 2023

(54) SEMICONDUCTOR CELL BLOCKS HAVING NON-INTEGER MULTIPLE OF CELL HEIGHTS

(71) Applicant: Samsung Electronics Co., Ltd., Suwon-si (KR)

(72) Inventors: Vassilios Gerousis, Liberty Hill, TX (US); Rwik Sengupta, Leander, TX (US); Joon Goo Hong, Austin, TX (US); Kevin Traynor, Livingston, TX (US); Tanya Abaya, Austin, TX (US); Dharmendar Palle, Austin, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 243 days.

(21) Appl. No.: 16/853,535

(22) Filed: Apr. 20, 2020

(65) Prior Publication Data

US 2021/0265334 A1   Aug. 26, 2021

Related U.S. Application Data

(60) Provisional application No. 62/979,080, filed on Feb. 20, 2020.

(51) Int. Cl.
*H01L 23/528* (2006.01)
*H01L 27/02* (2006.01)
*G06F 30/392* (2020.01)

(52) U.S. Cl.
CPC ........ *H01L 27/0207* (2013.01); *G06F 30/392* (2020.01); *H01L 23/5286* (2013.01)

(58) Field of Classification Search
CPC ............ H01L 27/0207; H01L 27/0688; H01L 23/5286; H01L 2027/11874; G06F 30/392; G06F 30/30
See application file for complete search history.

(56) References Cited

U.S. PATENT DOCUMENTS

| 9,007,095 B2 | 4/2015 | Penzes |
| 9,659,129 B2 | 5/2017 | Hsieh et al. |
| 2019/0164949 A1* | 5/2019 | Sio .................. H01L 27/0207 |

* cited by examiner

*Primary Examiner* — Nelson Garces
(74) *Attorney, Agent, or Firm* — Lewis Roca Rothgerber Christie LLP

(57) ABSTRACT

A semiconductor cell block includes a series of layers arranged in a stack. The layers include one or more first layers each having a first height and one or more second layers each having a second height. The second height is larger than the first height, and the second height is a non-integer multiple of the first height. The semiconductor cell block also includes a first semiconductor logic cell having a first cell height in one of the series of layers, and a second semiconductor logic cell having a second cell height in one of the series of layers. The second cell height is larger than the first cell height, and the second cell height is a non-integer value multiple of the first cell height.

7 Claims, 3 Drawing Sheets

SEMICONDUCTOR CELL BLOCKS HAVING NON-INTEGER MULTIPLE OF CELL HEIGHTS

CROSS-REFERENCE TO RELATED APPLICATION(S)

This application claims priority to and the benefit of U.S. Provisional Application No. 62/979,080, filed Feb. 20, 2020, the entire contents of which are incorporated herein by reference.

BACKGROUND

1. Field

Aspects of the present disclosure relate generally to semiconductor cell blocks and methods of forming layouts for semiconductor cell blocks.

2. Description of Related Art

Related art semiconductor cell blocks typically include semiconductor logic cells each having the same height or integer value multiples of the same height (e.g., double height or triple height). For instance, one semiconductor cell block of a chip may include a semiconductor logic cell having a first height and a semiconductor logic cell having a second height that is an integer value multiple of the first height. Another semiconductor cell block of the chip may include semiconductor logic cells having a third height and integer value multiples thereof.

SUMMARY

Aspects of the present disclosure relate to various embodiments of a semiconductor cell block. In one embodiment, the semiconductor cell block includes a series of layers arranged in a stack that includes one or more first layers each having a first height and one or more second layers each having a second height. The second height is larger than the first height, and the second height is a non-integer multiple of the first height. The semiconductor cell block also includes a first semiconductor logic cell having a first cell height in one of the series of layers, and a second semiconductor logic cell having a second cell height in one of the series of layers. The second cell height is larger than the first cell height, and the second cell height is a non-integer value multiple of the first cell height.

The non-integer value multiple may be in a range from approximately 1.1 to approximately 1.9.

The first semiconductor logic cell may be in one of the one or more first layers, and the second semiconductor logic cell is in one of the one or more second layers.

The one or more first layers may include a series of pairs of first layers stacked directly on each other.

The one or more first layers may include a series of first layer, the one or more second layers may include a series of second layers, and a number of first layers of the series of first layers may be larger than a number of second layers of the series of second layers.

The series of second layers may be regularly arranged in the stack, and each pair of adjacent second layers of the series of second layers may be spaced apart from each other by a same number of the first layers of the series of first layers.

The same number may be an even number.

The semiconductor cell block may also include a third semiconductor logic cell having a third cell height, and the third cell height may be an integer multiple of the first cell height.

The one or more first layers may include a series of first layers, and the third semiconductor logic cell may be in a pair of adjacent first layers of the series of first layers.

The semiconductor cell block may also include at least one power rail coupled to the first and second semiconductor logic cells.

The at least one power rail may be a buried power rail.

The first and second semiconductor logic cells may be different types of logic cells.

A first cell width of the first semiconductor logic cell and a second cell width of the second semiconductor logic cell may be integer value multiples of each other.

Aspects of the present disclosure also relate to various embodiments of a computer-implemented method of generating a layout for a semiconductor cell block. In one embodiment, the computer-implemented method includes placing, with a placement and routing tool, a first semiconductor cell in a first layer of a stack of layers and a second semiconductor cell in a second layer of the stack of layers. The first semiconductor cell has a first cell height and the second semiconductor cell has a second cell height larger than the first cell height, and the second cell height is a non-integer value multiple of the first cell height. The method also includes placing, with the placement and routing tool, pins on each of the first semiconductor cell and the second semiconductor cell, placing, with the placement and routing tool, vias connected to the pins, and placing, with the placement and routing tool, metal routing layers connected to the vias.

The non-integer value multiple may be in a range from approximately 1.1 to approximately 1.9.

The first layer may have a first height and the second layer may have a second height. The second height may be larger than the first height, and the second height may be a non-integer multiple of the first height.

The method may also include placing, with the placement and routing tool, at least one power rail in the stack of layers.

The method may also include placing, with the placement and routing tool, a third semiconductor logic cell in the stack. The third semiconductor logic cell may have a third cell height, the third cell height may be an integer value multiple of the first cell height.

The first layer may be one of a series of first layers including pairs of first layers stacked directly on each other, and the second layer may be one of a series of second layers. The second layer may be between adjacent pairs of the first layers.

A number of layers of the series of first layers may be larger than a number of layers of the series of second layers.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1A:
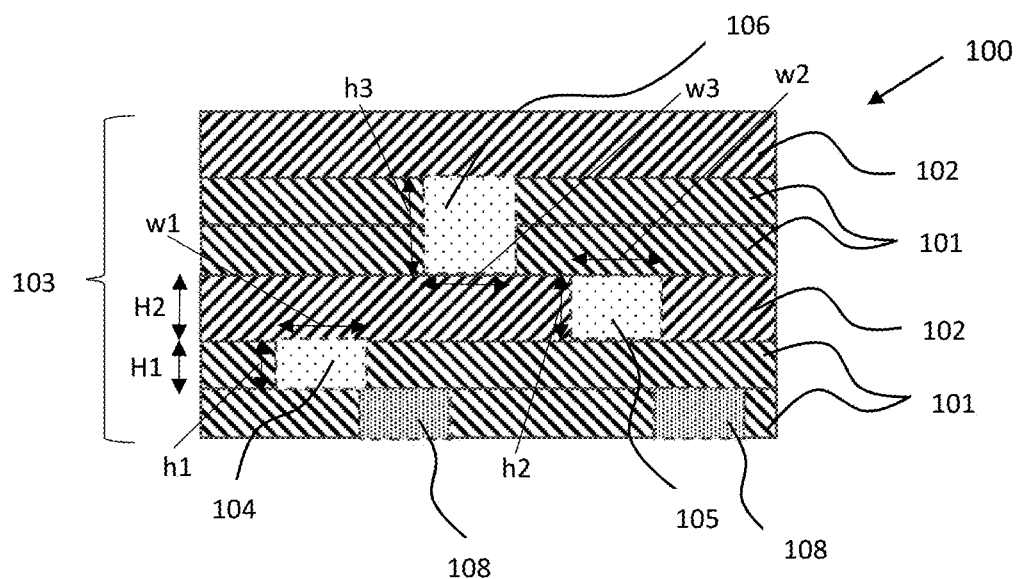
FIG. 1A is a schematic of a semiconductor cell block according to one embodiment of the present disclosure.

Aspects of the present disclosure relate to various embodiments of a semiconductor cell block including at least one semiconductor logic cell having a first height, and a least one semiconductor logic cell having a second height that is larger than the first height and is a non-integer value multiple of the first height. Additionally, in one or more embodiments, the semiconductor cell block of the present disclosure may include a semiconductor logic cell have a height that is an integer value multiple of the height of at least one other semiconductor logic cell in the semiconductor cell block. Accordingly, the semiconductor cell blocks according to various embodiments of the present disclosure can support both the lowest drive cells (e.g., D1 and D2) in the lowest height semiconductor logic cells, and bigger drive cells (e.g., D3 through D16 or D32) in the taller semiconductor logic cells. Additionally, the semiconductor cell blocks according to various embodiments of the present disclosure permit different device architectures to be located in the same semiconductor cell block. Aspects of the present disclosure also relate to various systems and methods of designing a layout of a semiconductor cell block including at least one semiconductor logic cell having a first height, and a least one semiconductor logic cell having a second height that is larger than the first height and is a non-integer value multiple of the first height.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1A, a semiconductor cell block 100 according to one embodiment of the present disclosure includes a series of layers 101, 102 (i.e., one or more first layers 101 and one or more second layers 102) stacked on top of each other to form a stack 103, and a series of semiconductor logic cells 104, 105, 106, and/or 107 in at least some of the layers 101, 102. Although in one or more embodiments the semiconductor cell block 100 includes each of the semiconductor logic cells 104, 105, 106, 107, in one or more embodiments, the semiconductor cell block 100 may include any suitable combination of the semiconductor logic cells 104, 105, 106, 107. The layers 101, 102 may correspond to front-end-of-line (FEOL) layers, middle-of-line (MOL) layers, and/or back-end-of-line (BEOL) layers (e.g., insulating layer V-2, metal layer Mint on insulating layer V-1, insulating layer V-1 on metal layer Mint, metal layer M0 on insulating layer V-1, insulating layer V0 on metal layer M0, metal layer M1 on insulating layer V0, insulating layer V1 on metal layer M1, metal layer M2 on insulating layer V1, insulating layer V2 on metal layer M2, etc.) of the semiconductor cell block 100.

The semiconductor logic cells 104, 105, 106, 107 may be any type(s) of cell(s), such as, for instance, an inverter, a NAND gate, a NOR gate, a counter, a flip flop, other logic circuits, or combinations thereof. The semiconductor logic cells 104, 105, 106, 107 may have different device architectures, such as, for instance, fin or sheet-based devices (e.g., finFETs or nanosheet FETs, such as horizontal nanosheet FETs or vertical FETs). Throughout the figures, the semiconductor logic cells 104, 105, 106, 107 are depicted schematically and the components of the semiconductor logic cells 104, 105, 106, 107 (e.g., the source/drain electrodes and the gates) are omitted for simplicity.

In the illustrated embodiments, the stack 103 includes a series of first layers 101 each having a first height H1, and a series of second layers 102 each having a second height H2 greater than the first height H1. In one or more embodiments, the second height H2 of the second layers 102 is a non-integer value multiple of the first height H1 of the first layers 101. For instance, in one or more embodiments, the second height H2 of the second layers 102 may be taller than the first height H1 of the first layers 101 and a non-integer value multiple of the first height H1 in a range from approximately (about) 1.1 to approximately (about) 1.9, such as approximately (about) 1.1, approximately (about) 1.15, approximately (about) 1.2, approximately (about) 1.3, approximately (about) 1.4, approximately (about) 1.5, approximately (about) 1.6, or approximately (about) 1.8.

In the illustrated embodiment, each of the semiconductor logic cells 104, 105, 106, 107 has a height equal or substantially equal to the height H1 of the first layers 101, a height equal or substantially equal to the height H2 of the second layers 102, or a height equal or substantially equal to a combined height of two or more adjacent layers 101, 102 of the stack 103. For instance, in the illustrated embodiment, the semiconductor cell block includes at least one first semiconductor cell 104 in one of the first layers 101 that has a first cell height h1 equal or substantially equal to the height H1 of the first layer 101 in which the first semiconductor cell 104 is located, and at least one second semiconductor cell 105 in one of the second layers 102 that has a second cell height h2 equal or substantially to the height H2 of the second layer 102 in which the second semiconductor cell 105 is located. Accordingly, in the illustrated embodiment, the second cell height h2 of the semiconductor logic cell 105 in the second layer 102 is greater than the first cell height h1 of the semiconductor logic cell 104 in the first layer 101 and the second cell height h2 is a non-integer value multiple of the first cell height h1. For instance, in one or more embodiments, the second cell height h2 of the semiconductor logic cell 105 in the second layer 102 is greater than the first cell height h1 of the semiconductor logic cell 104 in the first layer 101 and the second cell height h2 is a non-integer value multiple of the first cell height h1 in a range from approximately (about) 1.1 to approximately (about) 1.9.

In the illustrated embodiment, the stack 103 of the semiconductor cell block 100 includes a pair of the first layers 101 stacked directly on top of each other and a single second layer 102 on the pair of first layers 101 in a repeating pattern. In one or more embodiments, the semiconductor cell block 100 may include any other suitable arrangement (e.g., pattern) of the first and second layers 101, 102 depending, for instance, on the sizes and the types of semiconductor logic cells 104 in the semiconductor cell block 100. For instance, in one or more embodiments, the number of first layers 101 in the semiconductor cell block 100 is greater than the number of second layers 102 in the semiconductor cell block 100. In one or more embodiments, the semiconductor cell block 100 may include any number of the first layers 101 between adjacent ones of the second layers 102 (e.g., two, three, or four first layers 101 between each pair of adjacent second layers 102), which enables an integer multiple cell height (e.g., a double-height, triple-height, or quadruple-height semiconductor cell) (and visa-versa). Additionally, although in the illustrated embodiment the stack 103 includes two different types of layers each having a different height (i.e., the first layers 101 having the first height H1 and the second layers 102 having the second height H2), in one or more embodiments the stack 103 may include any other suitable number of different types of layers each having a different height (e.g., three or more types of layers each having a different height) and the three or more different types of layers may be arranged in any suitable pattern in the stack 103.

Figure 1B:
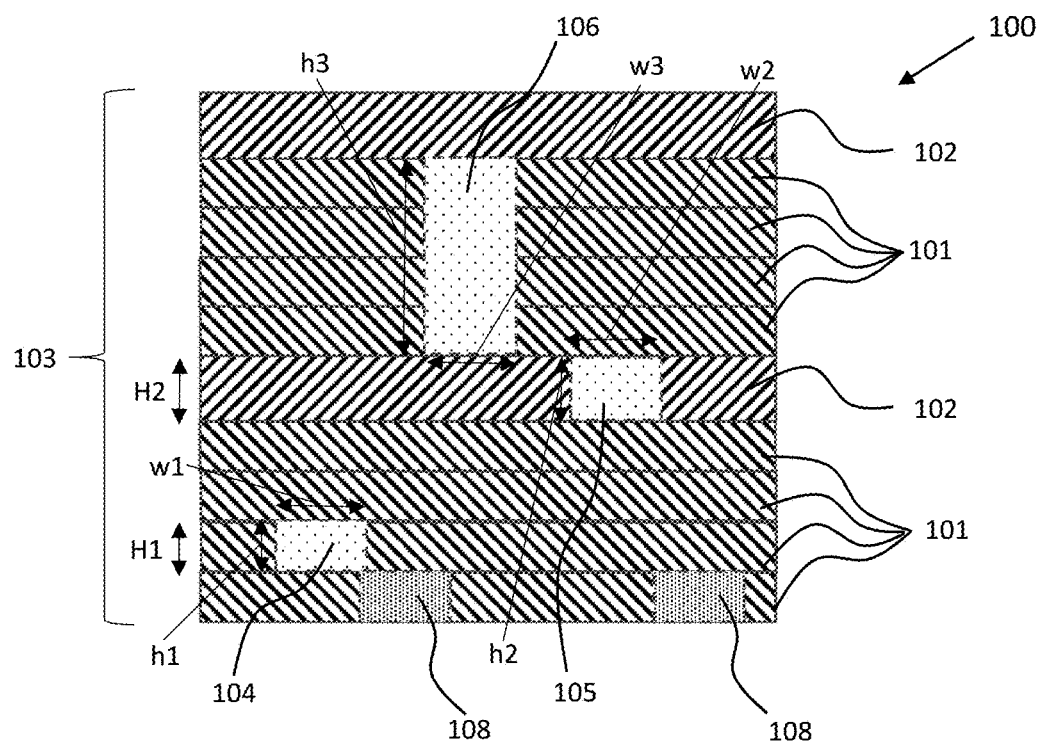
FIG. 1B is a schematic of a semiconductor cell block according to another embodiment of the present disclosure.
Figure 1C:
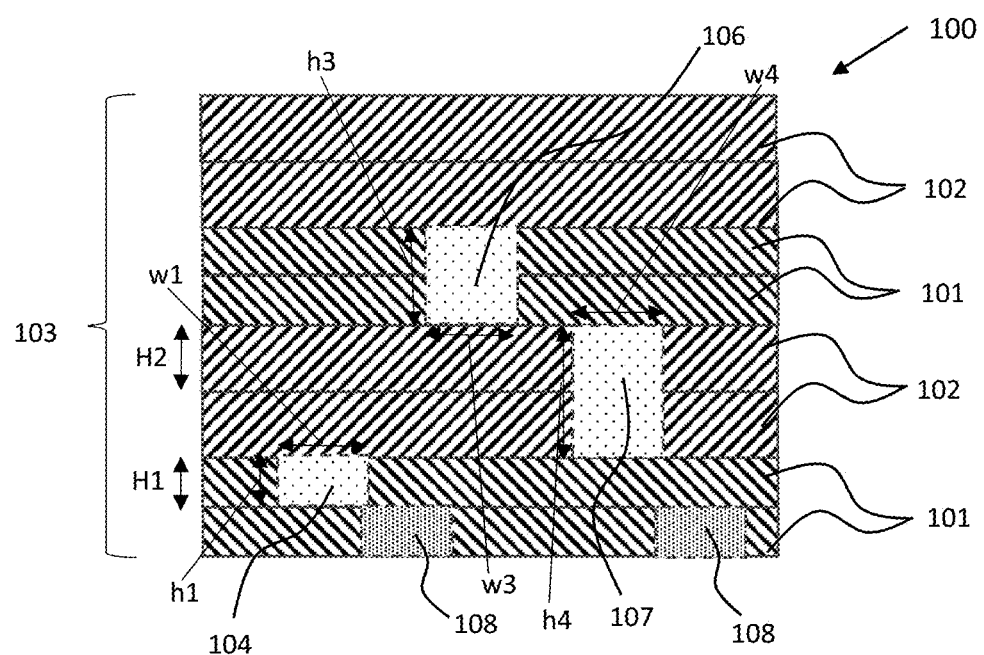
FIG. 1C is a schematic of a semiconductor cell block according to a further embodiment of the present disclosure.

In one or more embodiments, the semiconductor cell block 100 may include any even number or odd number of the first layers 101 between adjacent ones of the second layers 102. FIG. 1B depicts an embodiment of the semiconductor block cell 100 in which the stack 103 includes a repeating pattern of four first layers 101 stacked directly on top of each other and one second layer 102 on the stack of four first layers 101. In one or more embodiments, the stack 103 may have a number of adjacent first layers 101 depending on the desired height h3 of the semiconductor logic cell(s) 106 in those adjacent first layers 101 (i.e., the desired integer multiple of the height H1 of the first layers 101). Additionally, although in the illustrated embodiment adjacent second layers 102 are spaced apart from each other by two or more of the first layers 101, in one or more embodiments, the stack 103 may include a repeating pattern of two or more second layers 102 stacked directly on top of each other and two or more first layers 101 on the stack of two or more second layers 102, which enables placement of a semiconductor logic cell 107 in the two or more adjacent second layers 102 having a height equal to or substantially equal to an integer multiple of the height H2 of the second layers 102. For instance, FIG. 1C depicts an embodiment of the semiconductor cell block 100 in which the stack 103 includes a repeating pattern of two first layers 101 stacked directly on top of each other and two second layers 102 stacked directly on top of each other and on top of the stack of the two first layers 101. In the embodiment illustrated in FIG. 1C, the semiconductor cell block 100 includes at least one semiconductor logic cell 107 in two adjacent second layers 102 having a cell height h4 equal or substantially equal to the combined heights H2 the second layers 102. Accordingly, in the illustrated embodiment, the fourth cell height h4 of the semiconductor logic cell 107 in the two adjacent second layers 102 is an integer multiple value of the first cell height h2 of the semiconductor logic cell 105 illustrated in FIGS. 1A and 1B. In one or more embodiments in which the stack 103 of the semiconductor cell block 100 includes three, four, or five second layers 102 stacked directly on top of each other, the fourth cell height h4 of the semiconductor logic cell 107 in the adjacent second layers 102 may be three, four, or five times, respectively, the height H2 of the second layers 102.

In the illustrated embodiment, the semiconductor cell block 100 also includes at least one power rail 108 configured to deliver power (e.g., $V_{DD}$, $V_{SS}$, GND) to the semiconductor logic cells 104 in the semiconductor cell block 100. In one or more embodiments, one or more of the power rails 108 may be a buried power rail. The one or more power rails 108 overlap edges of the semiconductor logic cells 104, 105, 106, 107 in a plan view.

With continued reference to the embodiment illustrated in FIGS. 1A-1C, each of the semiconductor logic cells 104 in one of the first layers 101 has a first cell width w1, each of the semiconductor logic cells 105 in one of the second layers 102 has a second cell width w2, each of the semiconductor logic cells 106 extending through two or more adjacent first layers 101 has a third cell width w3, and each of the semiconductor logic cells 107 extending through two or more adjacent second layers 102 has a fourth cell width w4. In one or more embodiments, the first cell width w1 of the semiconductor logic cells 104 in one of the first layers 101 and the second cell width w2 of the semiconductor logic cells 105 in one of the second layers 102 are equal or substantially equal to each other. In one or more embodiments, the first cell width w1 of the semiconductor logic cells 104 in one of the first layers 101 and the second cell width w2 of the semiconductor logic cells 105 in one of the second layers 102 may be integer value multiples of each other (e.g., the second cell width w2 of the semiconductor logic cells 105 in one of the second layers 102 may be 1, 2, 3, or 4 times the first cell width w1 of the semiconductor logic cells 104 in one of the first layers 101, or vice versa). Additionally, although in one or more embodiments the first cell width w1 of the semiconductor logic cells 104 having the first cell height h1 may be equal or substantially equal to the third cell width w3 of the semiconductor logic cells 106 having the third cell height h3, in one or more embodiments, the third cell width w3 of the semiconductor logic cells 106 having the third cell height h3 may be an integer value multiple of the first cell width w1 of the semiconductor logic cells 104 having the first cell height h1, or vice versa. Moreover, although in one or more embodiments the second cell width w2 of the semiconductor logic cells 105 having the second cell height h2 may be equal or substantially equal to the fourth cell width w4 of the semiconductor logic cells 107 having the fourth cell height h4, in one or more embodiments, the fourth cell width w4 of the semiconductor logic cells 107 having the fourth cell height h4 may be an integer value multiple of the second cell width w2 of the semiconductor logic cells 105 having the second cell height h2, or vice versa.

Figure 2:
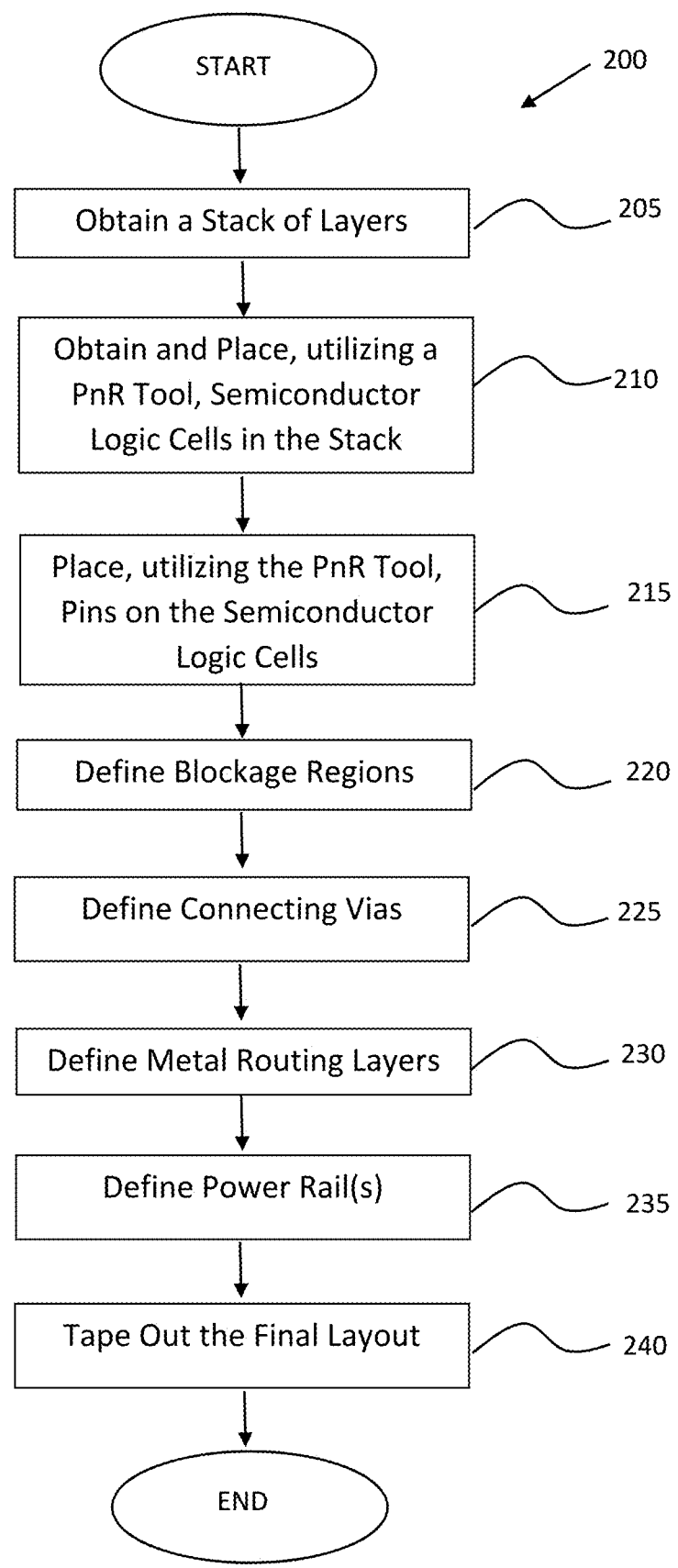
FIG. 2 is a flowchart illustrating tasks of a method of forming a layout for a semiconductor cell block according to one embodiment of the present disclosure.

FIG. 2 illustrates tasks of a method 200 of producing a layout for a semiconductor cell block (e.g., the embodiment of the semiconductor cell block 100 illustrated in FIG. 1A, 1B, or 1C) according to one embodiment of the present disclosure.

In the embodiment illustrated in FIG. 2, the method 200 includes a task 205 of obtaining a stack of one or more first layers and one or more second layers in a repeating pattern (e.g., the stack 103 of one or more first layers 101 and one or more second layers 102 shown in FIG. 1A, 1B, or 1C). The layers may correspond to front-end-of-line (FEOL) layers, middle-of-line (MOL) layers, and/or back-end-of-line (BEOL) layers (e.g., insulating layer V-2, metal layer Mint on insulating layer V-1, insulating layer V-1 on metal layer Mint, metal layer M0 on insulating layer V-1, insulating layer V0 on metal layer M0, metal layer M1 on insulating layer V0, insulating layer V1 on metal layer M1, metal layer M2 on insulating layer V1, insulating layer V2 on metal layer M2, etc.) of the semiconductor cell block.

In one or more embodiments, the first layers may have first height and the second layers have a second height greater than the first height. In one or more embodiments, the second height of the second layers may be a non-integer value multiple of the first height of the first layer, such as, for example, a non-integer value in a range from approximately 1.1 to approximately 1.9.

In the illustrated embodiment, the method 200 also includes a task 210 of obtaining semiconductor logic cells (e.g., the semiconductor logic cells 104, 105, 106, 107 shown in FIGS. 1A-1C) and placing the semiconductor logic cells, utilizing a placement and routing (PnR) tool, in the first layers and the second layers. In task 210, the semiconductor logic cells may be obtained from a library containing a series of different semiconductor cells (e.g., the semiconductor cells may be obtained from a standard cell library containing semiconductor cells having different configurations of the semiconductor devices). The semiconductor logic cells may have different device architectures, such as, for instance, fin or sheet-based devices (e.g., finFETs or nanosheet FETs, such as horizontal nanosheet FETs or vertical FETs). In task 210, the semiconductor logic cells placed in the first layers have heights that are equal or substantially equal to the height of each of the first layers, and the semiconductor devices placed in the second layers have heights that are equal or substantially equal to the height of each of the second layers. Accordingly, the height of the semiconductor devices placed in the second layers is greater than the height of the semiconductor devices placed in the first layer, and the height of the semiconductor devices placed in the second layers is a non-integer value multiple of the height of the semiconductor devices placed in the first layers, such as, for example, a non-integer value multiple in a range from approximately 1.1 to approximately 1.9.

In one or more embodiments, the task 210 may include placing one or more semiconductor logic devices in two or more adjacent first layers, and the one or more semiconductor logic devices placed in the two or more adjacent first layers have height(s) equal to an integer value multiple of the height of each of the first layers (e.g., double-height, triple-height, and/or quadruple-height semiconductor devices). In one or more embodiments, the task 210 may include placing one or more semiconductor logic devices in two or more adjacent second layers, and the one or more semiconductor logic devices placed in the two or more adjacent second layers have height(s) equal to an integer value multiple of the height of each of the second layers (e.g., double-height, triple-height, and/or quadruple-height semiconductor devices).

In the illustrated embodiment, the method 200 also includes a task 215 of placing, utilizing the PnR tool, a series of pins on the semiconductor cells placed in task 210. The pins placed in task 215 are configured to enable connection from the semiconductor cells placed in task 210 to one or more routing metal layers with vias dropped by the PnR tool in a subsequent task. As used herein, the term "pins" refers to the metal wires within each of the semiconductor cells that define connection points for external connections to the semiconductor cells (e.g., inter-cell connections between one semiconductor cell and another semiconductor cell). Additionally, the pins may be output pins (e.g., connection points for output signals of the semiconductor cells), input pins (e.g., connection points for input signals of the semiconductor cell), or a combination of input and output pins. In one or more embodiments, the pins may be placed in one or more middle-of-line (MOL) layers and may define source, drain, and gate contacts of the semiconductor devices.

In task 215, the pins may be placed anywhere within a legal boundary (i.e., anywhere within an area that does not violate ground rules). In one or more embodiments, in task 215, the pins may be oriented on a routing grid or off of the routing grid. The term "routing grid" refers to a grid on which objects of the semiconductor cell 200 are aligned to, and, according to one or more embodiments, may refer to the finest granularity that can be achieved during a manufacturing process for producing the semiconductor cells and the semiconductor cell block. In one or more embodiments, in task 215, the pins may be oriented vertically and/or horizontally in a plan view. In one or more embodiments, the task 215 may include redefining the locations of the pins iteratively in congested areas to improve routing quality of results (QoR). The task 215 of defining the pins includes positioning the pins such that the virtual pins do not block other pin access on the same semiconductor cell or semiconductor cells placed nearby. Additionally, the task 215 of defining the pins includes locating the pins such that the semiconductor cells can be routed without creating design rule conflict in the semiconductor cell or other semiconductor cells nearby. Furthermore, the task 215 of defining the pins includes locating the pins such that the pins do not violate ground rules with respect to other routing metal shapes.

In one or more embodiments, the method 200 may include a task 220 of defining one or more blockage regions defining obstructions. In the illustrated embodiment, the one or more blockage regions may be defined in the same layer as the pins. The blockage regions define areas in which the pins cannot be placed.

In the illustrated embodiment, the method 200 also includes a task 225 of defining connecting vias (i.e., pin access vias) overlapping the pins placed in task 215 (e.g., the PnR tool is constrained to place the connecting vias over the pins). The connecting vias define the locations of vias that enable connection between the pins and metal routing layers, placed by the PnR tool during a subsequent task of the method 200. In one or more embodiments, the task 225 of defining the connecting vias includes checking for ground rule violations for middle-of-line (MOL) shapes and layers and placing the connecting vias in any legal locations utilizing any suitable algorithms known in the art. That is, in task 225, the PnR tool places the connecting vias based on a series of ground rule restrictions, including the minimum area to place a ground rule clean connecting via (e.g., the task of placing the vias avoids design rules violations of the via shapes to other shapes on the same layer).

In the embodiment illustrated in FIG. 2, the method 200 also includes a task 230 of defining metal routing layers on the connecting vias to make connections to the connecting vias in a ground rule clean manner. The task 230 of defining the metal routing layers may be performed by any suitable algorithm(s) known in the art.

In the embodiment illustrated in FIG. 2, the method 200 includes a task 235 of defining one or more power rails configured to deliver power (e.g., $V_{DD}$, $V_{SS}$, GND) to the semiconductor logic cells in the semiconductor cell block. In one or more embodiments, the power rails placed in task 235 may be buried power rails. In one or more embodiments, the task 235 may include defining one or more power and ground staples or stripes in addition to, or instead of, the one or more power rails (e.g., the task 235 may include defining one or more pairs of double power staples). The one or more power rails (and/or the power and ground staples or stripes) are regions in which power rails (and/or power staples or power stripes) may be added depending on the desired power suitable for the intended application. The task 235 of defining the one or more power rails (and/or the power and ground staples or stripes) may be added prior to the placement of the semiconductor cells within the semiconductor cell block.

In the illustrated embodiment, after the design layout is finalized, the method 200 may include a task 240 of taping out the final layout (i.e., the graphic for the photomask of the semiconductor cell block is sent to the fabrication facility). The task 240 of taping out the final layout may include a task of outputting, by the PnR tool, a final GDSII or other suitable file format for production of the photomasks. Additionally, in one or more embodiments, the method 200 may include a task of fabricating a semiconductor die to form the integrated cell block and one or more packing and assembly tasks to produce a finished semiconductor chip.

In one or more embodiments, the methods 200 of the present disclosure may be performed by and/or utilizing computer-executable instructions (e.g., electronic design automation (EDA) software) stored in a non-volatile memory device which, when executed by a processor, cause the processor to perform the tasks described above. Additionally, the tasks described above may including displaying the layout of the semiconductor cell (e.g., the layout of the shadow pin regions) and the semiconductor integrated circuit on a display. The term "processor" is used herein to include any combination of hardware, firmware, and software, employed to process data or digital signals. The hardware of a processor may include, for example, application specific integrated circuits (ASICs), general purpose or special purpose central processors (CPUs), digital signal processors (DSPs), graphics processors (GPUs), and programmable logic devices such as field programmable gate arrays (FPGAs). In a processor, as used herein, each function is performed either by hardware configured, i.e., hard-wired, to perform that function, or by more general purpose hardware, such as a CPU, configured to execute instructions stored in a non-transitory storage medium. A processor may be fabricated on a single printed wiring board (PWB) or distributed over several interconnected PWBs. A processor may contain other processors; for example a processor may include two processors, an FPGA and a CPU, interconnected on a PWB.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention.

What is claimed is:

1. A computer-implemented method of generating a layout for a semiconductor cell block, the computer-implemented method comprising:
 placing, with a placement and routing tool, a first semiconductor cell in a first layer of a stack of layers and a second semiconductor cell in a second layer of the stack of layers, the first semiconductor cell having a first cell height and the second semiconductor cell having a second cell height larger than the first height, the second cell height being a non-integer value multiple of the first cell height;
 placing, with the placement and routing tool, pins on each of the first semiconductor cell and the second semiconductor cell;
 placing, with the placement and routing tool, vias connected to the pins; and
 placing, with the placement and routing tool, metal routing layers connected to the vias,
 wherein the first cell height and the second cell height are defined in a vertical direction perpendicular to a plane in which the metal routing layers extend.

2. The computer-implemented method of claim 1, wherein the non-integer value multiple is in a range from approximately 1.1 to approximately 1.9.

3. The computer-implemented method of claim 1, wherein the first layer has a first height and the second layer has a second height, wherein the second height is larger than the first height, and wherein the second height is a non-integer multiple of the first height.

4. The computer-implemented method of claim 1, further comprising placing, with the placement and routing tool, at least one power rail in the stack of layers.

5. The computer-implemented method of claim 1, further comprising placing, with the placement and routing tool, a third semiconductor logic cell in the stack, the third semiconductor logic cell having a third cell height, wherein the third cell height is an integer value multiple of the first cell height.

6. The computer-implemented method of claim 1, wherein:
 the first layer is one of a plurality of first layers, the plurality of first layers comprising pairs of first layers stacked directly on each other, and
 the second layer is one of a plurality of second layers, the second layer being between adjacent pairs of the first layers.

7. The computer-implemented method of claim 6, wherein a number of layers of the plurality of first layers is larger than a number of layers of the plurality of second layers.

* * * * *